United States Patent
Kim et al.

(10) Patent No.: US 10,473,702 B2
(45) Date of Patent: Nov. 12, 2019

(54) ESTIMATING OPERATION STATE OF INDIVIDUAL LOAD

(71) Applicant: KT CORPORATION, Gyeonggi-do (KR)

(72) Inventors: Seon-Mi Kim, Seoul (KR);
Kyung-Gyu Park, Gyeonggi-do (KR);
Byung-Deok Chung, Seoul (KR)

(73) Assignee: KT CORPORATION, Gyeonggi-do (KR)

( * ) Notice: Subject to any disclaimer, the term of this patent is extended or adjusted under 35 U.S.C. 154(b) by 489 days.

(21) Appl. No.: 14/541,139

(22) Filed: Nov. 13, 2014

(65) Prior Publication Data
US 2015/0134279 A1 May 14, 2015

(30) Foreign Application Priority Data

Nov. 13, 2013 (KR) ........................ 10-2013-0137440

(51) Int. Cl.
*G01R 21/133* (2006.01)

(52) U.S. Cl.
CPC ................ *G01R 21/1338* (2013.01)

(58) Field of Classification Search
CPC .................................................. G01R 21/1338
USPC .......... 702/44, 60–61, 64–65; 364/483, 492, 364/511
See application file for complete search history.

(56) References Cited

U.S. PATENT DOCUMENTS

| | | | |
|---|---|---|---|
| 6,968,295 B1 * | 11/2005 | Carr ..................... | G06Q 10/06 700/286 |
| 2003/0093390 A1 | 5/2003 | Onoda et al. | |
| 2005/0052976 A1 | 3/2005 | Kim | |
| 2008/0080524 A1 * | 4/2008 | Tsushima ................ | H04L 12/18 370/401 |
| 2012/0072040 A1 * | 3/2012 | Kaji .......................... | H02J 3/14 700/291 |
| 2012/0152511 A1 * | 6/2012 | Chang ................ | B60H 1/00428 165/202 |
| 2013/0020871 A1 * | 1/2013 | Takehara ................. | H02J 3/14 307/32 |
| 2014/0277808 A1 * | 9/2014 | Irisarri ................... | G05B 15/02 700/295 |
| 2014/0300187 A1 * | 10/2014 | Kojima ................... | H02J 3/381 307/24 |
| 2015/0046135 A1 * | 2/2015 | Ito ........................... | G06F 17/10 703/2 |

(Continued)

FOREIGN PATENT DOCUMENTS

JP 2001-330630 A 11/2001
JP 2006-017456 A 1/2006
(Continued)

*Primary Examiner* — Mohammed Shamsuzzaman
(74) *Attorney, Agent, or Firm* — IP Legal Services, LLC

(57) ABSTRACT

The disclosure is related to a method for estimating an operation state of each individual load in a target electric power consumer. The method may include obtaining an operation state table of a target electric power consumer upon generation of a predetermined event, collecting predetermined electricity parameter values in response to a request to estimate an operation state of each individual load, and estimating operation states of individual loads in the target electric power consumer based on the obtained operation state table and the collected predetermined electricity parameter values.

15 Claims, 5 Drawing Sheets

(56) References Cited

U.S. PATENT DOCUMENTS

| | | | | |
|---|---|---|---|---|
| 2015/0084416 A1* | 3/2015 | Nishibayashi | ......... | H02J 3/383 |
| | | | | 307/12 |
| 2015/0309092 A1* | 10/2015 | Yu | ............................ | H02J 3/24 |
| | | | | 702/66 |
| 2016/0124400 A1* | 5/2016 | Kanayama | ............. | G05B 13/02 |
| | | | | 307/116 |
| 2016/0154038 A1* | 6/2016 | Toizumi | ................. | G01R 21/00 |
| | | | | 702/61 |
| 2016/0344189 A1* | 11/2016 | Ozaki | ..................... | H02J 3/381 |

FOREIGN PATENT DOCUMENTS

| | | |
|---|---|---|
| JP | 5010011 B2 | 8/2012 |
| JP | 2013-213825 A | 10/2013 |
| KR | 10-0222761 B1 | 10/1999 |
| KR | 10-0865576 B1 | 10/2008 |
| KR | 10-0950490 B1 | 3/2010 |
| KR | 10-2010-0046631 A | 5/2010 |
| KR | 10-0980781 B1 | 9/2010 |
| KR | 10-2012-0072306 A | 7/2012 |
| KR | 10-2013-0035577 A | 4/2013 |
| WO | 01/077696 A1 | 10/2001 |

\* cited by examiner

|  | Operation state of individual load ||||||| Electricity parameter values ||||||
|  | A | B | C | D | E | F | G | P1 | P2 | P3 | P4 | P5 | P6 |
|---|---|---|---|---|---|---|---|---|---|---|---|---|---|
| T1 | 1 | 1 | 1 | 1 | 1 | 1 | 1 | T1P1 | T1P2 | T1P3 | T1P4 | T1P5 | T1P6 |
| T2 | 1 | 1 | 1 | 1 | 1 | 1 | 0 | T2P1 | T2P2 | T2P3 | T2P4 | T2P5 | T2P6 |
| T3 | 1 | 1 | 1 | 1 | 1 | 0 | 1 | T3P1 | T3P2 | T3P3 | T3P4 | T3P5 | T3P6 |
| ⋮ | ⋮ | ⋮ | ⋮ | ⋮ | ⋮ | ⋮ | ⋮ | ⋮ | ⋮ | ⋮ | ⋮ | ⋮ | ⋮ |
| T128 | 0 | 0 | 0 | 0 | 0 | 0 | 0 | T128P1 | T128P2 | T128P3 | T128P4 | T128P5 | T128P6 |

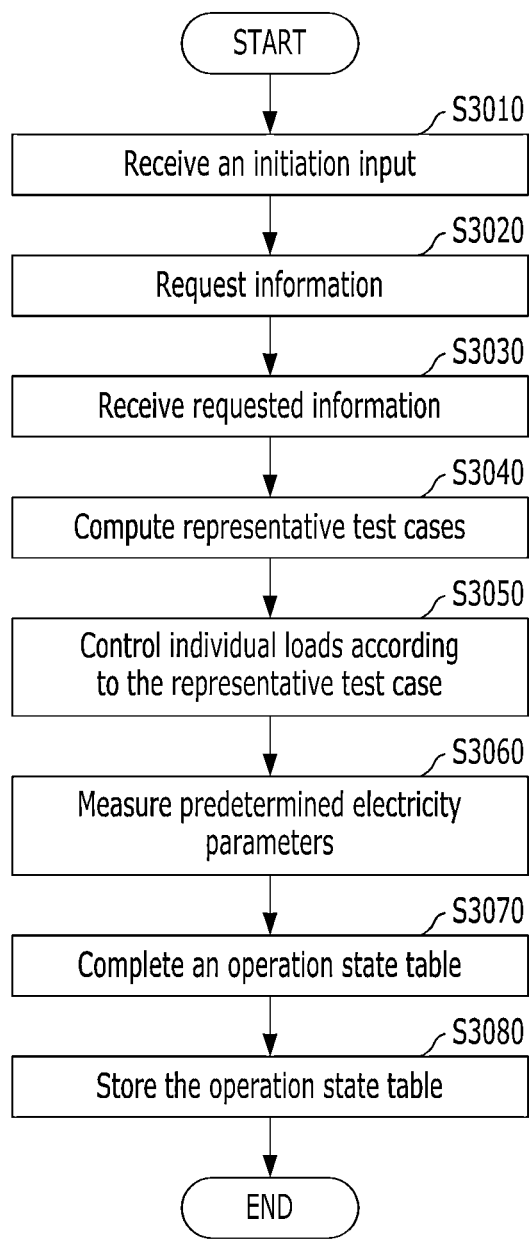

FIG. 4

| | Operation state of individual load | | | | | | |
|---|---|---|---|---|---|---|---|
| | A | B | C | D | E | F | G |
| OT1 | 1 | 1 | 1 | 1 | 1 | 1 | 1 |
| OT2 | 1 | 1 | 1 | 0 | 0 | 0 | 0 |
| OT3 | 1 | 0 | 0 | 1 | 1 | 0 | 0 |
| OT4 | 1 | 0 | 0 | 0 | 0 | 1 | 1 |
| OT5 | 0 | 1 | 0 | 1 | 0 | 1 | 0 |
| OT6 | 0 | 1 | 0 | 0 | 1 | 0 | 1 |
| OT7 | 0 | 0 | 1 | 1 | 0 | 0 | 1 |
| OT8 | 0 | 0 | 1 | 0 | 1 | 1 | 0 |
| OT9 | 0 | 0 | 0 | 0 | 0 | 0 | 0 |

FIG. 5

| | Operation state of individual load | | | | | | | Electricity parameter values | | | | | |
|---|---|---|---|---|---|---|---|---|---|---|---|---|---|
| | A | B | C | D | E | F | G | P1 | P2 | P3 | P4 | P5 | P6 |
| OT1 | 1 | 1 | 1 | 1 | 1 | 1 | 1 | OT1P1 | OT1P2 | OT1P3 | OT1P4 | OT1P5 | OT1P6 |
| OT2 | 1 | 1 | 1 | 0 | 0 | 0 | 0 | OT2P1 | OT2P2 | OT2P3 | OT2P4 | OT2P5 | OT2P6 |
| OT3 | 1 | 0 | 0 | 1 | 1 | 0 | 0 | OT3P1 | OT3P2 | OT3P3 | OT3P4 | OT3P5 | OT3P6 |
| OT4 | 1 | 0 | 0 | 0 | 0 | 1 | 1 | OT4P1 | OT4P2 | OT4P3 | OT4P4 | OT4P5 | OT4P6 |
| OT5 | 0 | 1 | 0 | 1 | 0 | 1 | 0 | OT5P1 | OT5P2 | OT5P3 | OT5P4 | OT5P5 | OT5P6 |
| OT6 | 0 | 1 | 0 | 0 | 1 | 0 | 1 | OT6P1 | OT6P2 | OT6P3 | OT6P4 | OT6P5 | OT6P6 |
| OT7 | 0 | 0 | 1 | 1 | 0 | 0 | 1 | OT7P1 | OT7P2 | OT7P3 | OT7P4 | OT7P5 | OT7P6 |
| OT8 | 0 | 0 | 1 | 0 | 1 | 1 | 0 | OT8P1 | OT8P2 | OT8P3 | OT8P4 | OT8P5 | OT8P6 |
| OT9 | 0 | 0 | 0 | 0 | 0 | 0 | 0 | OT9P1 | OT9P2 | OT9P3 | OT9P4 | OT9P5 | OT9P6 |

|  | Operation state of individual load |  |  |  |  |  |  | Electricity parameter values |  |  |  |  |  |
|---|---|---|---|---|---|---|---|---|---|---|---|---|---|
|  | A | B | C | D | E | F | G | P1 | P2 | P3 | P4 | P5 | P6 |
| T1 | 1 | 1 | 1 | 1 | 1 | 1 | 1 | T1P1 | T1P2 | T1P3 | T1P4 | T1P5 | T1P6 |
| T2 | 1 | 1 | 1 | 1 | 1 | 1 | 0 | T2P1 | T2P2 | T2P3 | T2P4 | T2P5 | T2P6 |
| T3 | 1 | 1 | 1 | 1 | 1 | 0 | 1 | T3P1 | T3P2 | T3P3 | T3P4 | T3P5 | T3P6 |
| T4 | 1 | 1 | 1 | 1 | 0 | 1 | 1 | T4P1 | T4P2 | T4P3 | T4P4 | T4P5 | T4P6 |
| T5 | 1 | 1 | 1 | 0 | 1 | 1 | 1 | T5P1 | T5P2 | T5P3 | T5P4 | T5P5 | T5P6 |
| . | . | . | . | . | . | . | . | . | . | . | . | . | . |
| . | . | . | . | . | . | . | . | . | . | . | . | . | . |
| . | . | . | . | . | . | . | . | . | . | . | . | . | . |
| T128 | 0 | 0 | 0 | 0 | 0 | 0 | 0 | T128P1 | T128P2 | T128P3 | T128P4 | T128P5 | T128P6 |

ESTIMATING OPERATION STATE OF INDIVIDUAL LOAD

CROSS REFERENCE TO PRIOR APPLICATIONS

The present application claims priority under 35 U.S.C. § 119 to Korean Patent Application No. 10-2013-0137440 (filed on Nov. 13, 2013).

BACKGROUND

The present disclosure relates to estimating individual loads and, more particularly, to estimating operation states of individual loads in an electric power consumer based on predetermined electricity parameter values measured from a meter of the electric power consumer without measuring electric parameter value from each individual load.

A building energy management system (BEMS) has been introduced to efficiently manage electric power consumption and supply. Such a BEMS collects and analyzes information on electric power consumption from an electric power consumer. The BEMS may use such collection and analysis results to efficiently manage electric power consumption and supply. The electric power consumer (e.g., a room of a hotel) may include a plurality of electronic devices (e.g., individual loads) that actually consume the electric power. However, it is difficult and requires high cost to monitor and collect information on electric power consumption of each individual load in the electric power consumer.

SUMMARY

This summary is provided to introduce a selection of concepts in a simplified form that is further described below in the Detailed Description. This summary is not intended to identify key features or essential features of the claimed subject matter, nor is it intended to be used to limit the scope of the claimed subject matter.

Embodiments of the present invention overcome the above disadvantages and other disadvantages not described above. Also, the present invention is not required to overcome the disadvantages described above, and an embodiment of the present invention may not overcome any of the problems described above.

In accordance with an aspect of the present embodiment, operation states of individual loads in an electric power consumer may be estimated based on an operation state table and predetermined electricity parameters measured from a meter of the electric power consumer.

In accordance with at least one embodiment, a method may be provided for estimating an operation state of each individual load in a target electric power consumer. The method may include obtaining an operation state table of a target electric power consumer upon generation of a predetermined event, collecting predetermined electricity parameter values in response to a request to estimate an operation state of each individual load, and estimating operation states of individual loads in the target electric power consumer based on the obtained operation state table and the collected predetermined electricity parameter values.

The operation state table may include information on operation states of individual loads, mapped with corresponding electricity parameter values. Such an operation states mapped with first electricity parameter values may mean the first electricity parameter values are measured from a meter of the target electric power consumer when the individual loads in the target electric power consumer respectively have the operation states mapped to the first electricity parameter values. The operation state may include an On-state and an Off-state and the predetermined electricity parameter values include at least one of a voltage, a current, an alternating current frequency, a power factor, an active power, a reactive power, an apparent electric power, and a harmonic wave.

The obtaining an operation state table may include initiating the obtaining an operation state table when an operation state table of the target electric power consumer is not available.

The obtaining an operation state table may include computing a comparatively small number of representative test cases using orthogonal collocation based on a number of individual loads in the target electric power consumer and a number of operation states of each individual load. Each one of the representative test cases may include operation states of individual loads in the target electric power consumer.

The obtaining an operation state table may include measuring predetermined electricity parameter values from a meter of the target electric power consumer while controlling the individual loads in the target electric power consumer according to operation states in the computed representative test cases, generating a partial operation state table by mapping the obtained electricity parameter values with the representative test cases, and completing the operation state table for the target electric power consumer using the generated partial operation state table.

The completing an entire operation state table may include generating a regression analysis equation using the obtained electricity parameter values of the representative test cases and generating electricity parameter values of the remaining test cases using the generated regression analysis equation.

The collecting predetermined electricity parameter values may include controlling a meter of the target electric power consumer to measure the predetermined electricity parameter values.

The estimating operation states of individual loads may include estimating operation states of the individual loads in the target electric power consumer using at least one of the collected predetermined electricity parameter values received from a meter of the target electric power consumer.

The estimating operation states of individual loads may include determining electric parameter values in the operation state table, matched with the collected electric parameter values, comparing operation states in the operation state table, mapped to the determined electric parameter values, detecting most matched operation states of the individual loads based on the comparison results, and estimating the detected most matched operation states as estimated operation states of the individual loads in the target electric power consumer.

The method may include storing the generated operation state table in a memory and providing information on the estimated operation states of the individual loads to user equipment of a requested user.

In accordance with another embodiment, a device may be provided for estimating an operation state of each individual load in a target electric power consumer. The device may include a measuring circuit and a processor.

The measuring circuit may be configured to collect predetermined electricity parameter values from a meter of the target electric power consumer. The processor may be configured to obtain an operation state table of a target electric power consumer upon generation of a predetermined event and estimate operation states of individual loads in the target electric power consumer based on the obtained operation state table and the collected predetermined electricity parameter values.

The operation states mapped with first electricity parameter values may mean the first electricity parameter values are measured from a meter of the target electric power consumer when the individual loads in the target electric power consumer respectively have the operation states mapped to the first electricity parameter values.

The processor may be configured to compute a comparatively small number of representative test cases using orthogonal collocation based on a number of individual loads in the target electric power consumer and a number of operation states of each individual load. Each one of the representative test cases may include operation states of individual loads in the target electric power consumer.

The processor may be configured to measure predetermined electricity parameter values from a meter of the target electric power consumer while controlling the individual loads in the target electric power consumer according to operation states in the computed representative test cases, to generate a partial operation state table by mapping the obtained electricity parameter values with the representative test cases, and to complete the operation state table for the target electric power consumer using the generated partial operation state table.

The processor may be configured to generate a regression analysis equation using the obtained electricity parameter values of the representative test cases and generate electricity parameter values of the remaining test cases using the generated regression analysis equation.

The processor may be configured to estimate operation states of the individual loads in the target electric power consumer using at least one of the collected predetermined electricity parameter values received from a meter of the target electric power consumer.

The processor may be configured to determine electric parameter values in the operation state table, matched with the collected electric parameter values, to compare operation states in the operation state table, mapped to the determined electric parameter values, to detect most matched operation states of the individual loads based on the comparison results, and to estimate the detected most matched operation states as estimated operation states of the individual loads in the target electric power consumer.

BRIEF DESCRIPTION OF THE DRAWINGS

The above and/or other aspects of some embodiments of the present invention will become apparent and more readily appreciated from the following description of embodiments, taken in conjunction with the accompanying drawings, of which:

FIG. 3 illustrates a flowchart of generating an operation state table of an electric power consumer in accordance with at least one embodiment;

FIG. 4 shows exemplary representative test cases each having orthogonal characteristic, selected from entire test cases, in accordance with at least one embodiment;

FIG. 5 illustrates sums OT1P1 to OT9P6 of predetermined electricity parameters P1 to P6 of individual loads A to G in accordance with at least one embodiment;

DETAILED DESCRIPTION OF EMBODIMENTS

Figures 1, 2:
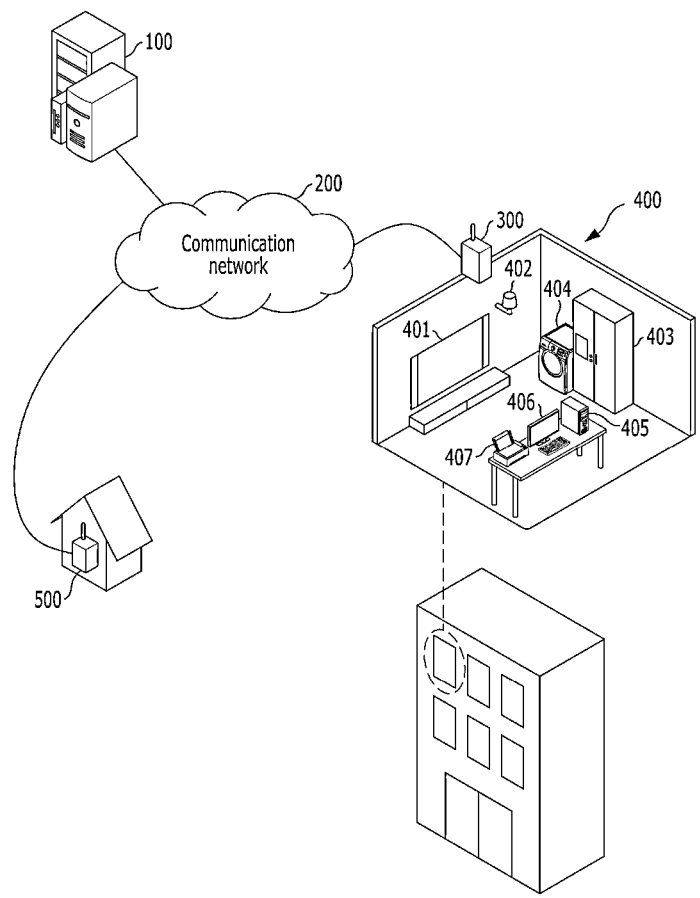
FIG. 1 illustrates estimating an operation state of an individual load installed at an electric power consumer in accordance with at least one embodiment.
FIG. 2 illustrates an operation state table in accordance with at least one embodiment.

Reference will now be made in detail to exemplary embodiments of the present invention, examples of which are illustrated in the accompanying drawings, wherein like reference numerals refer to like elements throughout. The embodiments are described below, in order to explain embodiments of the present invention by referring to the figures.

In accordance with at least one embodiment, an operation state of an individual load in an electric power consumer may be estimated with installing a measuring device at each individual load. In particular, electricity parameters may be collected from an electricity meter installed at each consumer and an operation state of an individual load in the consumer may be estimated based on the obtained electricity parameters without installing an electricity meter at each individual load. Hereinafter, such an operation of estimating an operation state of an individual load will be described with reference to FIG. 1.

FIG. 1 illustrates estimating an operation state of an individual load installed at an electric power consumer in accordance with at least one embodiment.

Referring to FIG. 1, an operation state of an individual load may be estimated by device 100 coupled to meter 300 of an electric power consumer through communication network 200 or a wireless communication link directly established to meter 300 in accordance with at least one embodiment. The operation state may include an On-state and Off-state. The individual load may be an electronic device that actually consumes electricity power to perform predetermined operations, such as TV 401, light 402, refrigerator 403, washing machine 404, personal computer 405, monitor 406, printer 407, and so forth. The electric power consumer may be a set of individual loads. The electric power consumer may be a unit of measuring electric power consumption. For example, the electric power consumer may be each room 400 of a hotel, house 500, an office, a hospital, and an apartment building, but the present invention is not limited thereto. For example, On/Off states of electronic devices installed in each room in a hotel may be estimated by device 100 based on predetermined electricity parameters collected from a meter of the corresponding room.

Such device 100 for estimating an operation state of an individual load may be coupled to communication network 200. Such communication network 200 may be a smart grid. The smart grid may be a modernized interconnected network for delivering electricity from suppliers to consumers. The smart grid may be an electric grid that employs digital information and communications technology to collect and manage information about behaviors of suppliers and consumers in an automated fashion to improve the efficiency, reliability, economics, and sustainability of the production and distribution of electricity. The smart grid may be a meter data management system (MDMS). Accordingly, device 100 may collect information from the smart grid managing and distributing electricity to consumers.

Device 100 is illustrated as being coupled to meter 300 through communication network 200 in FIG. 1, but the present invention is not limited thereto. Device 100 may be coupled to meter 200 directly through a wireless communication link established between device 100 and meter 200. Such a wireless communication link may be a short distance communication link, such as a Bluetooth link.

Meter 300 may be installed at each consumer, such as each room 400 in a hotel, house 500 (e.g., meter 301), an office, an apartment building, and so forth. Meter 300 may be a device capable of measuring electricity parameters, capable of communicating with other entities through communication network 200 or a smart grid, and having a processing power to perform a predetermined operation in response to a user input. Meter 300 may be a building energy management system (BEMS), but the present invention is not limited thereto. In particular, meter 300 may measure the electricity parameters associated with the individual load. The electricity parameters may be electric variables that express electric properties as a numeric value. Such electricity parameters may include a voltage, a current, a frequency of an alternating current (e.g., alternating current frequency), a power factor, an active power, a reactive power, an apparent electric power, and a harmonic wave. The present invention, however, is not limited thereto.

Device 100 may be an electronic device capable of communicating with other entities through communication network 200 or a wireless communication link and capable of processing predetermined data to perform a predetermined operation. Such device 100 may include a personal computer (PC), a computing server, a handheld device, user equipment, a smart phone, a tablet PC, a pad-like device, a personal digital assistance (PDA), and so forth, but the present invention is not limited thereto.

In particular, device 100 may collect predetermined electricity parameters from meter 300 and estimate operation states of individual loads in an electric power consumer based on the collected electricity parameters in accordance with at least one embodiment. For example, device 100 may use an operation state table to estimate operation states of individual loads in accordance with at least one embodiment. The operation state table may include information on operation states of respective individual loads, mapped with sums of predetermined electricity parameters. Accordingly, based on the sums of collected electricity parameters, device 100 may estimate operation states of individual loads in accordance with at least one embodiment.

In particular, device 100 may i) calculate a predetermined set of test cases for generating the operation state table for the target electric power consumer, ii) obtain information on predetermined electricity parameters collected from a meter of the target electric power consumer for the calculated test cases, iii) complete the operation state table by calculating sums of the predetermined electric parameters of the remaining cases, iv) collect the predetermined electric parameters from the meter for estimating the operation states, v) calculate the sums of the collected electric parameters, and vi) estimate the operation states based on the case mapped to the calculated sums in the operation state table.

Accordingly, an operation state of each individual load may be estimated without installing a measuring device (e.g., meter) at each individual load in accordance with at least one embodiment. Such estimation operation may be applied to estimate which electronic devices in each room of a hotel are turned on or turned off without spending high expense in order to manage electricity consumption in the hotel. The estimation operation might be beneficially applied to an electric power consumer group including a plurality of electric power consumers each having the similar or same individual loads (e.g., electronic devices). However, the present invention is not limited thereto. The estimation operation may be identically applied to any electric power consumer, such as a house, an office, and so forth. Hereinafter, such operation of device 100 will be described with reference to FIG. 2 to FIG. 7. First of all, the operation state table will be described with reference to FIG. 2.

FIG. 2 illustrates an operation state table in accordance with at least one embodiment.

Referring to FIG. 2, the operation state table may include information on all of combinations (e.g., test cases) of operation states of respective individual loads, mapped with corresponding electric parameter values. Each one of the corresponding electric parameter values may be a sum of electric parameter values measured from each individual loads. In particular, FIG. 2 shows an operation state table showing operation states of seven different individual loads mapped with corresponding six different electricity parameters. However, the present invention is not limited to the number of individual loads and the number of electricity parameters.

In FIG. 2, an individual load A denotes TV 401, an individual load B denotes light 402, an individual load C denotes refrigerator 403, an individual load D denotes washing machine 404, an individual load E denotes personal computer 405, an individual load F denotes monitor 406, and an individual load G denotes printer 407. An operation state of each individual load is one of an On-state and an Off-state. In the operation state table of FIG. 2, 1 denotes the On-state and 0 denotes the Off-state. In addition, an electricity parameter P1 denotes a voltage, an electricity parameter P2 denotes a current, an electricity parameter P3 denotes a frequency of an alternating current, an electricity parameter P4 denotes a power factor, an electricity parameter P5 denotes an active power, and an electricity parameter P6 denotes a reactive power.

As described, when each one of seven different individual loads A to G has two operation states (e.g., On/Off-state), there will be one hundred twenty eight different combinations ($2^7$) of operation states of seven different individual loads. Each combination may be referred to as a test case. For example, a first combination T1 denotes that all of individual loads A to G have On-states. A second combination T2 denotes that individual loads A to F have On-states and individual load G has an Off-state. A third combination T3 denotes that individual loads A to E and G have On-states and individual load F has an Off-state.

In addition, an electric parameter value TxPx may denote a value of an electric parameter Px (e.g., electric parameter value) measured from a meter of a corresponding power consumer when individual loads in the corresponding power consumer have operation states shown in a test case Tx, where x denotes an integer number. For example, an electricity parameter value T1P1 may be equivalent to a sum of electric parameter values P1 (e.g., voltage) collected from each one of individual loads A to G when all of individual loads A to G have On-states (e.g., the first combination T1). That is, the electric parameter value T1P1 may be a first parameter value measured from a meter of an electric power consumer having individual loads A to G when all individual loads A to G have on-states. An electric parameter value T1P2 denotes a sum of second parameter values P2 (e.g., current) collected from all individual loads A to G when all individual loads A to G have On-states (e.g., the first combination T1). Furthermore, an electric parameter value T3P1 denotes a sum of first parameters P1 (e.g., voltage) collected from all individual loads A to G when individual loads A to E and G have On-states and individual load F has Off-state.

As shown in FIG. 2, such an operation state table shows predetermined electricity parameter values, mapped to corresponding combinations of operation states of individual loads. Accordingly, operation stations of individual loads can be estimated by measuring values of the predetermined electricity parameters and calculating sums of the predetermined electric parameter values.

In accordance with at least one embodiment, such an operation state table of a target electric power consumer may be generated in response to a user request or upon generation of a predetermined event. Such operation will be described with reference to FIG. 3 to FIG. 5.

FIG. 3 illustrates a flowchart of generating an operation state table of an electric power consumer in accordance with at least one embodiment.

Referring to FIG. 3, an initiation input for generating an operation state table may be received at step S3010. For example, device 100 may receive an initiation input from a user. When a user requests estimating operation states of individual loads in a target electric power consumer and if no operation state table for the target electric power consumer is available, the initiation input for generating an operation state table may be generated. Furthermore, when a user wants to generate an operation state table for a new electric power consumer, the initiation input for generating an operation state table may be generated.

At step S3020, information on electricity parameters, individual loads, and operation states of each individual loads may be requested. For example, device 100 may request entering parameter information and individual load information. The parameter information may include information on the number of predetermined electricity parameters, types, and default values, and so forth. The individual load information may include information on the number of individual loads in a target electric power consumer, types of the individual loads, the number of operation states each individual load has, types of each operation state, and so forth.

Alternatively, the parameter information and the individual load information may be predetermined and stored in device 100 or stored in other entities coupled to communication network 200 and/or an associated smart grid. In this case, device 100 may fetch the information from a memory of device 100 or obtain the information from the other entities by requesting the other entities to provide the information.

At step S3030, the requested information may be obtained. For example, device 100 may receive the parameter information and the individual load information in response to the request. Device 100 may obtain such information directly from an associated user. In this case, device 100 may provide a user interface that enables a user to enter the requested information. For example, device 100 may allow a user to access device 100 through user equipment (e.g., a smart phone) of the user and provide a graphic user interface to the user equipment to enable the user to enter the information. Such a graphic user interface may be provided through a web-site published on Internet by a related service server or may be provided through an application installed and executed in the user equipment of the user.

The parameter information and the individual load information were illustrated as being requested to an associated user, but the present invention is not limited thereto. Such information may be previously set by at least one of an operator, a system designer, a service provider, and a user and stored in device 100. In this case, device 100 may read the stored information from memory 130 of device 100. That is, operations S3020 and S3030 may be omitted.

At step S3040, representative test cases may be computed. For example, the representative test cases may be referred to as representative combinations. In order to generate an operation state table, device 100 may perform operations for i) controlling individual loads according to operation states in a corresponding test case (e.g., combination), ii) measuring values of all predetermined electricity parameters, iii) calculating sums of the predetermined electricity parameters, and iv) storing the calculated sums in the operation state table. Device 100 may repeat at least four operations for all test cases (e.g., combinations). For example, when seven individual loads are included in a target electric power consumer and each one of the seven individual loads has two operation states, the number of test cases (e.g., combinations) is 128 (e.g., $2^7$). That is, device 100 must perform the above four operations 128 times for generating the operation state table.

In accordance with at least one embodiment, a part of test cases may be selected from all of the test cases as representative test cases and results obtained from the representative test case (e.g., representative test case results) may be used to complete the entire operation state table instead of perform the above operations for all of test cases. In particular, such representative combination (e.g., representative test cases) may be computed using orthogonal collocation in accordance with at least one embodiment. Using the orthogonal collocation, only eight representative test cases each having orthogonal characteristics may be selected from one hundred twenty eight test cases when seven individual loads are included in a target electric power consumer and each one of the seven individual loads has two operation states.

FIG. 4 shows exemplary representative test cases each having orthogonal characteristic, selected from entire test cases, in accordance with at least one embodiment. Referring to FIG. 4, nine representative test cases OT1 to OT9 are selected from one hundred twenty eight test cases. In accordance with at least one embodiment, the taguchi analysis method may be used to select the representative test cases OT1 to OT8. Furthermore, one more test case OT9 is selected for default electric power consumption.

As shown, such a representative test case table (e.g., a table of orthogonal arrays) may be defined according to the number of operation states of each individual load and the number of individual loads in a target electric power consumer. That is, at step S3040, device 100 computes representative test cases having orthogonal characteristics according to the number of operation states and the number of individual load in accordance with at least one embodiment.

At step S3050, the individual loads may be controlled according to operation states in the computed representative test cases. For example, device 100 may control the individual loads in the target electric power consumer based on operation states in the representative test cases. In particular, for the first representative test case OT1, device 100 may control all of individual loads A to G to be turned on. For the second representative test case OT2, device 100 may control individual loads A to C to be turned on and control individual loads D to G to be turned off based on the table shown in FIG. 4.

Such control may be performed through an automation gateway (e.g., smart home gateway for automation network) coupled to all of electronic devices in room 400, but the present invention is not limited thereto. In another embodiment, such control may be requested to an operator or an associated authorized person.

At step S3060, values of predetermined electricity parameters P1 to P6 may be measured. For example, after controlling individual loads for each representative test case, device 100 may measure values of predetermined electric parameters from meter 300 of room 400. In case of the first representative test case OT1, device 100 measures a voltage value OT1P1 from meter 300 while turning on all of individual loads 401 to 407 and device 100 measures a current value OT1P2 from meter 300 while turning on all of individual loads 401 to 407. Although the voltage value OT1P1 is directly measured from meter 300, it might be equivalent to a sum of voltage values of individual loads 401 to 407.

By repeating similar operations for all of the representative test cases OT1 to OT9, device 100 may generate a partial operation state table for the representative test cases, as shown in FIG. 5. FIG. 5 illustrates measured electricity parameter values OT1P1 to OT9P6 from a meter of the target electric power consumer while controlling the individual loads A to G according to operation states in the representative test cases OT1 to OT9.

Referring back to FIG. 3, an entire operation state table may be completed based on the partial operation state table of the representative test cases at step S3070. For example, device 100 may complete the entire operation state table using the partial operation state table of the representative test cases. In order to complete the entire operation state table, device 100 may compute regression analysis equations for six electricity parameters P1 to P6 from the partial operation state table of the representative test cases of FIG. 5. When the number of individual loads is seven and the number of operation states of each individual load is two, a regression analysis equation for the electricity parameter P1 (e.g. voltage) may be computed as Equation 1 below.

$$Y(P1)=\beta_0+\beta_1 A+\beta_2 B+\beta_3 C+\beta_4 D+\beta_5 E+\beta_6 F+\beta_7 G \quad \text{Equation 1}$$

In Equation 1, Y(P1) denotes a voltage value P1 measured from a meter of an electric power consumer having individual loads A to G while controlling operation states of the individual loads A to G according to representative test cases. $\beta_0$ is a constant. $\beta_1$ to $\beta_7$ are assay coefficients of individual loads A to G, respectively. Such a constant $\beta_0$ and assay coefficients $\beta_1$ to $\beta_7$ may be computed based on the representative test case results. In particular, since there are nine representative test cases OT1 to OT9, device 100 may compute and use nine equations to obtain assay coefficients, $\beta_0$ to $\beta_7$. For example, device 100 may obtain assay coefficient as follows: $\beta_0=4.9108923$, $\beta_1=5.68265428$, $\beta_2=4.53026437$, $\beta_3=2.47152956$, $\beta_4=7.28456841$, $\beta_5=8.55705182$, $\beta_6=6.5008343$, and $\beta_7=2.832122569$.

That is, Y (P1) of any test cases may be calculated by 4.9108923+(5.68265428)A+(4.53026437)B+(2.47152956)C+(7.28456841)D+(8.55705182)E+(6.5008343)F+(2.832122569)G. Using the equation 1 with the obtained assay coefficient $\beta_0$ to $\beta_7$, electricity parameter values T1P1 to T128P6 for total one hundred eleven test cases may be calculated and the entire operation state table may be generated.

That is, device 100 i) computes the comparatively small number of representative test cases using orthogonal collocation, ii) obtains predetermined electricity parameter values of the representative test cases, iii) generates regression analysis equations for each electricity parameter value using the obtained electricity parameter values of the representative test cases, and iv) generates electricity parameter values of all test cases using the generated regression analysis equations in accordance with at least one embodiment.

Equation 1 is a regression analysis equation for electric parameter value P1 (e.g., voltage value). Similar equation may be generated for other electric parameter values P2 to P6 by computing representative test cases using orthogonal collocation, obtaining electric parameter values P2 to P6 of the representative test cases, and generating regression analysis equations using the obtained electricity parameter values P2 to P6 of the representative test cases.

For example, in case of electric parameter value P2 (e.g., current value), device 100 computes nine representative test cases based on orthogonal collocation, obtains results of the nine representative test cases, generates a partial operation state table using the obtained results, and generates a representative regression analysis equation (Y(P2)) by calculating assay coefficient $\beta_0$ to $\beta_7$. Using the regression analysis equation (Y(P2)), device 100 may calculate any electricity parameter values TxP2 for the remaining one hundred nineteen test cases.

After completing the entire operation state table, device 100 estimates operation states of individual loads in the target electric power consumer by measuring predetermined electricity parameter values from meter 300 of the target electric power consumer in accordance with at least one embodiment. Hereinafter, such operation will be described with reference to FIG. 6 and FIG. 7.

Figure 6:
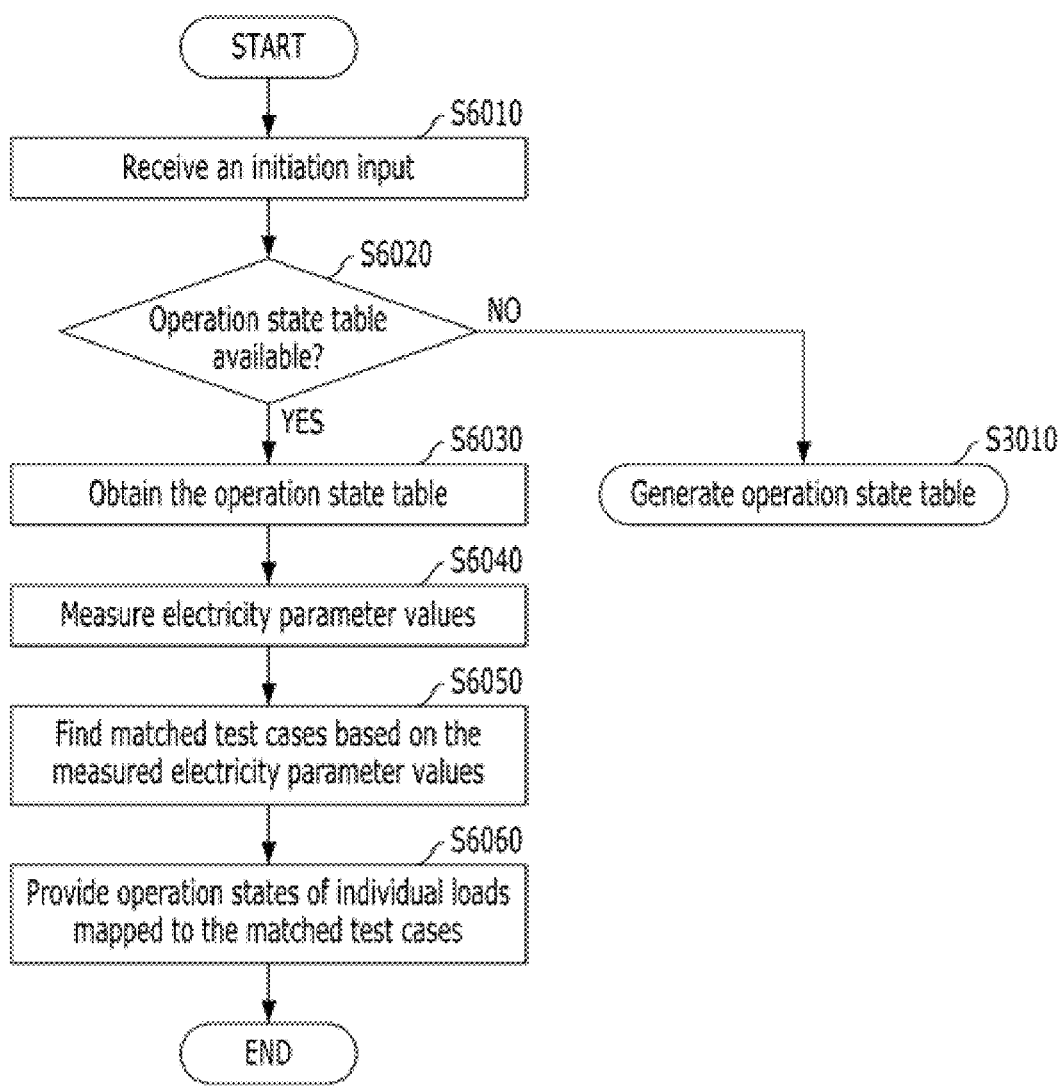
FIG. 6 illustrates a method of estimating an operation state of each individual load in an electric power consumer in accordance with at least one embodiment.

FIG. 6 illustrates a method of estimating an operation state of each individual load in an electric power consumer in accordance with at least one embodiment.

Referring to FIG. 6, an initiation input for an estimation operation may be received at step S6010. For example, device 100 may receive a user input to initiate an estimation operation through an input circuit of device 100. In particular, a user (e.g., operator) enters a request input to perform the estimation operation through a predetermined user interface provided by device 100 and input information on a target electric power consumer such as house 500 or room 400 of a hotel.

Alternatively, a user may access device 100 using predetermined user equipment such as a smart phone or a pad-like device through communication network 200. For example, the user equipment may obtain and install a designated application, execute the installed application, produce a graphic user interface as a result of the execution, and display the produced graphic user interface. Through the graphic user interfaced, a user may be enabled to access device 100, to request to perform an estimation operation, and to enter information on a target electric power consumer.

At step S6020, determination may be made so as whether an operation state table is available. For example, in response to the initiation input from the user, device 100 determines whether an operation state table associated with the target electric power consumer is previously generated and stored at a memory. Such an operation state table of an electric power consumer may be previously generated and stored at not only in device 100 but also in an associated entity (e.g., service server) coupled to device 100 through communication network 300. The operation state table may show operation states of respective individual loads in relation with predetermined electricity parameter values as shown in FIG. 3.

When the operation state table associated with the target electric power consumer is not available (No-S6020), the operation state table may be generated for the target electric power consumer at step S3010 of FIG. 3. Since the generation of the operation state table was already described with reference to FIG. 3, the detailed description thereof will be omitted herein.

When the operation state table associated with the target electric power consumer is available (Yes-S6020), the operation state table may be obtained at step S6030. For example, device 100 may fetch the operation state table associated with the target electric power consumer from memory 120 of device 100. Alternatively, device 100 may obtain the operation state table from other entities coupled to communication network 200, for example, a related service server coupled to communication network 200.

At step S6040, predetermined electric parameter values may be measured. For example, device 100 may control meter 300 to measure the predetermined electricity parameter values P1 to P6 and collect the measured electric parameter values P1 to P6 from meter 300. Since the electricity parameter values P1 to P6 were already described, the detailed description thereof will be omitted herein.

At step S6050, test cases (e.g., combinations) mapped with the collected electric parameter values may be searched through the operation s state table. For example, device 100 may analyze the collected electricity parameter values P1 to P6 and find, from the operation state table, test cases (e.g., combinations) mapped to at least one of electricity parameter values P1 to P6 matched with the collected electric parameter values P1 to P6.

Figures 7, 8:
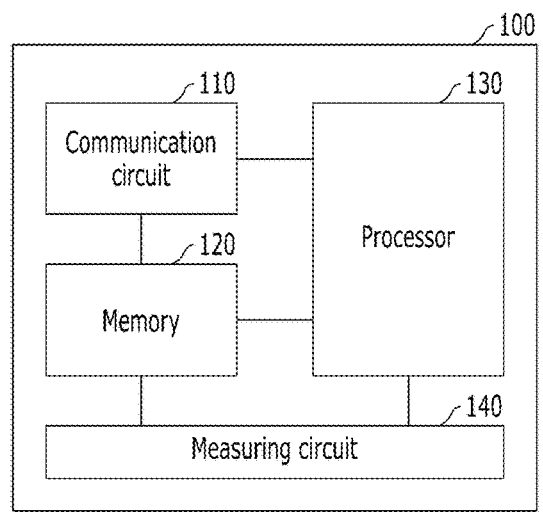
FIG. 7 shows finding test cases having measured electric parameter values in accordance with at least one embodiment.
FIG. 8 illustrates a device of estimating an operation state of an individual load in an electric power consumer in accordance with at least one embodiment.

FIG. 7 shows finding test cases having measured electric parameter values in accordance with at least one embodiment. Referring to FIG. 7, the operation state table includes shadowed electricity parameter values T1P2, T2P1, T2P2, T2P3, T2P4, P2P5, T2P6, T3P1, T3P2, T3P4, T4P2, T4P4, and T5P3. It is assumed that the shadowed electricity parameter values in the operation state table are approximately matched with the collected electricity parameter values.

As shown in FIG. 7, two electricity parameter values T2P1 and T3P1 (e.g., voltage value) are matched with the collected electricity parameter value P1, four electricity parameter values T1P2, T2P2, T3P2, and T4P2 (e.g., current value) are matched with the collected electricity parameter value P2, three electricity parameter values T2P3 and T5P3 (e.g., power factor) are matched with the collected electricity parameter value P3, three electricity parameter values T2P4, T3P4, and T4P4 (e.g., active power) is matched with the collected electricity parameter value P4, one electricity parameter value T2P5 (e.g., inactive power) is matched with the collected electricity parameter value P5, and one electricity parameter value T2P6 (e.g., frequency) is matched with the collected electricity parameter value P6.

In this case, device 100 may determine operation states of individual loads A to G as follows. Device 100 may compare operation states of individual loads A to G mapped with the electricity parameter value T2P1 with those mapped with the electricity parameter value T3P1. That is, the operation states of individual loads A to E mapped to the electricity parameter value T2P1 are matched with the operation states of individual loads A to E mapped to the electricity parameter value T3P1, but the operation states of individual loads F and G mapped to the electricity parameter value T2P1 are not matched with the operation states of individual loads F and G mapped to the electricity parameter value T3P1. Accordingly, device 100 may further compare operation states of individual loads A to G mapped with the electricity parameter values T1P2, T2P2, T3P2, and T4P2. When there are operation states still not matched, device 100 may still further compare operation states of individual loads A to G mapped with the electricity parameter values T2P3 and T5P3. Based on the comparison result, device 100 finds the most matched operation states as estimated operation states of individual loads A to G. However, the present invention is not limited thereto.

For example, when more than a predetermined number of electricity parameter values at the same test case in the operation state table are approximately matched with electric parameter values measured from a meter, device 100 may determine operation states of the corresponding test case as estimated operation states. As shown in FIG. 7, all of electricity parameter values T2P1 to T2P6 of the second test case T2 are matched with electricity parameter values measured from the meter. In this case, device 100 may determine operation states of the second test case as the estimated operation states of individual loads.

Referring back to FIG. 6, at step S6060, the operation states of individual loads may be provided. For example, device 100 may provide the most matched operation states of individual loads as the estimated operation states of individual loads A to G. In particular, device 100 may display the operation states on a predetermined display unit or transmit information on the operation states to the user equipment of the user through communication network 200. Accordingly, the user may be aware of operation states of individual loads in a target electric power consumer without installing a meter to each individual load in accordance with at least one embodiment.

As described, device 100 may be an electronic device capable of communication with other entities coupled to communication network 200 and having a processing power to perform a predetermined operation in accordance with at least one embodiment. Such device 100 will be described with reference to FIG. 8.

FIG. 8 illustrates a device of estimating an operation state of an individual load in an electric power consumer in accordance with at least one embodiment.

Referring to FIG. 8, device 100 may include communication circuit 110, memory 120, processor 130, and measuring circuit 140. Communication circuit 110 may receive information, data, and/or signals from and transmit information, data, and/or signal to other entities including meter 300 of a consumer. Communication circuit 110 may include at least one module for communicating with other entities in a smart grid. For example, communication circuit 110 may include any or all of a broadcasting signal receiving module, a mobile communication module, a wireless internet module, a short-distance communication module, and a location information module (e.g., GPS receiving module). The short-distance communication module may include a Bluetooth circuit, a radio frequency identification (RFID) circuit, an infrared data association (IrDA) circuit, an ultra-wideband (UWB) circuit, a Zigbee circuit, and a near field communication (NFC) module circuit. In particular, communication circuit 110 may include a transmitter and a receiver.

Communication circuit 110 may receive, through communication network 200 or a direct communication link, signals from a plurality of meters (e.g., meter 300) of consumers, but the present invention is not limited thereto. Communication circuit 110 may receive such signals from predetermined entities of an existing smart grid, for example, from a management server of the smart grid. The received signals may include information on electricity parameter values measured at the meter. In addition, the received signals may include electricity parameter information and individual load information.

Memory 120 may be data storage storing information necessary for driving device 100 and performing certain operation upon generation of a predetermined event. Such information may include any software programs and related data. Memory 120 may be a flash memory, hard disk, multimedia card micro memory, SD or XD memory, Random Access Memory (RAM), Static Random Access Memory (SRAM), Read-Only Memory (ROM), Programmable Read-Only Memory (PROM), Electrically Erasable Programmable Read-Only Memory (EEPROM), magnetic memory, magnetic disk, or optical disk, but is not limited thereto. In particular, memory 120 may store an operation state table, electricity parameter information, and individual load information in accordance with at least one embodiment.

Processor 130 may control associated constituent elements and other entities (e.g., meter 300) coupled through communication network 200. For example, processor 130 may be a central control unit (CPU) of server 100. Processor 120 may control constituent elements of device 100 for performing operations for estimating operation states of individual loads in a target electric power consumer in accordance with at least one embodiment. As described, processor 130 may perform various operations to estimate the operation states.

For example, processor 130 may perform i) an operation for generating an operation state table (e.g., On/Off table) in accordance with at least one embodiment. The operation state table may include information on an operation state (e.g., On/Off state) of each individual load mapped with electricity parameter values measured from the target electric power consumer including the plurality of individual loads. Processor 130 may perform ii) an operation for collecting the electricity parameter values from meter 300 based on electricity parameters associated with individual load. For example, the electricity parameter value is also referred to as a sum of electricity parameter values of each individual load included in the electric power consumer in accordance with at least one embodiment. Processor 130 may perform iii) an operation for determining operation states of each individual load based on the operation state table and the collected electricity parameter values.

Measuring circuit 140 may control meter 300 to measure electricity parameter values and collect the measured electricity parameter values from meter 300. Measuring circuit 140 may provide the measured electricity parameter values to processor 130 or store the collected electricity parameter values in memory 120.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Moreover, the terms "system," "component," "module," "interface,", "model" or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

The present invention can be embodied in the form of methods and apparatuses for practicing those methods. The present invention can also be embodied in the form of program code embodied in tangible media, non-transitory media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of a bitstream or other sequence of signal values electrically or optically transmitted through a medium, stored magnetic-field variations in a magnetic recording medium, etc., generated using a method and/or an apparatus of the present invention.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

No claim element herein is to be construed under the provisions of 35 U.S.C. § 112, sixth paragraph, unless the element is expressly recited using the phrase "means for" or "step for."

Although embodiments of the present invention have been described herein, it should be understood that the foregoing embodiments and advantages are merely examples and are not to be construed as limiting the present invention or the scope of the claims. Numerous other modifications and embodiments can be devised by those skilled in the art that will fall within the spirit and scope of the principles of this disclosure, and the present teaching can also be readily applied to other types of apparatuses. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of managing and distributing electricity, the method comprising:
    receiving an initiation input to generate an estimated operation state of each individual load in a target electric power consumer;
    obtaining an operation state table of the target electric power consumer in response to the generated event, wherein the operation state table includes information on all combinations of operation states of each of the individual load in the target electric power consumer mapped with corresponding electricity parameter values;
    wherein the operation states of individual loads is mapped with first electricity parameter values, wherein the first electricity parameter values are measured from a meter of the target electric power consumer when the individual loads in the target electric power consumer respectively have the operation states mapped to the first electricity parameter values;
    initiating the estimate of the operation state of each individual load in the target electric power consumer by measuring and collecting predetermined electric parameter values from a single measuring source;
    wherein the operation state includes an On-state and an Off-state and an electricity parameter value includes at least one of a voltage, a current, an alternating current frequency, a power factor, an active power, a reactive power, an apparent electric power, and a harmonic wave;
    wherein a predetermined electric parameter value denotes a sum of the electricity parameter value collected from all individual loads considering each individual loads condition of on and off state;
    comparing the measured and collected predetermined electric parameters with the obtained operation state table; and
    managing the target electric power consumer based on the estimated operation states of the individual loads in the target electric power consumer to distribute the electricity.

2. The method of claim 1, wherein the obtaining an operation state table comprises:
    obtaining the operation state table when an operation state table of the target electric power consumer is not available.

3. The method of claim 2, wherein the obtaining an operation state table comprises:
    computing a comparatively small number of representative test cases using orthogonal collocation based on a number of individual loads in the target electric power consumer and a number of operation states of each individual load.

4. The method of claim 3, wherein each one of the representative test cases comprises operation states of individual loads in the target electric power consumer.

5. The method of claim 3, wherein the obtaining an operation state table comprises:
    measuring predetermined electricity parameter values from a meter of the target electric power consumer while controlling the individual loads in the target electric power consumer according to operation states in the computed representative test cases;
    generating a partial operation state table by mapping the obtained electricity parameter values with the representative test cases; and
    completing the operation state table for the target electric power consumer using the generated partial operation state table.

6. The method of claim 5, wherein the completing an entire operation state table comprises:
    generating a regression analysis equation using the obtained electricity parameter values of the representative test cases; and
    generating electricity parameter values of the remaining test cases using the generated regression analysis equation.

7. The method of claim 1, wherein the collecting predetermined electricity parameter values comprises:
    controlling a meter of the target electric power consumer to measure the predetermined electricity parameter values.

8. The method of claim 1, wherein the estimating operation states of individual loads comprises:
    estimating operation states of the individual loads in the target electric power consumer using at least one of the collected predetermined electricity parameter values received from a meter of the target electric power consumer.

9. The method of claim 8, wherein the estimating operation states of individual loads comprises:
    determining electric parameter values in the operation state table, matched with the collected electric parameter values;
    comparing operation states in the operation state table, mapped to the determined electric parameter values;
    detecting most matched operation states of the individual loads based on the comparison results; and
    estimating the detected most matched operation states as estimated operation states of the individual loads in the target electric power consumer.

10. The method of claim 1, comprising:

storing the generated operation state table in a memory; and providing information on the estimated operation states of the individual loads to user equipment of a requested user.

11. A system for managing and distributing electricity, the system comprising:

a single meter to measure electricity parameter values for all combinations of operations states of each individual load in a target electric power consumer to generate an operation state table, and to measure predetermined electric parameter values of each individual load in a target electric power consumer in response to an initiation input; and wherein the operation states of individual loads is mapped with first electricity parameter values, wherein the first electricity parameter values are measured from the single meter of the target electric power consumer when the individual loads in the target electric power consumer respectively have the operation states mapped to the first electricity parameter values;

wherein the operation state includes an On-state and an Off-state and an electricity parameter value includes at least one of a voltage, a current, an alternating current frequency, a power factor, an active power, a reactive power, an apparent electric power, and a harmonic wave;

wherein a predetermined electric parameter value denotes a sum of the electricity parameter value collected from all individual loads considering each individual loads condition of on and off state;

a processor coupled to the single meter to obtain the operation state table, collect the predetermined electronic parameter values, and compare the obtained operation state table and the collected predetermined electronic parameter values to estimate operation states of the individual loads in the target electric power consumer, wherein the processor manages the target electric power consumer based on the estimated operation states of the individual loads in the target electric power consumer to distribute the electricity.

12. The system of claim 11, wherein:

the processor is configured to compute a comparatively small number of representative test cases using orthogonal collocation based on a number of individual loads in the target electric power consumer and a number of operation states of each individual load; and each one of the representative test cases comprises operation states of individual loads in the target electric power consumer.

13. The system of claim 12, wherein the processor is configured to:

measure predetermined electricity parameter values from the meter of the target electric power consumer while controlling the individual loads in the target electric power consumer according to operation states in the computed representative test cases;

generate a partial operation state table by mapping the obtained electricity parameter values with the representative test cases; and complete the operation state table for the target electric power consumer using the generated partial operation state table.

14. The system of claim 12, wherein the processor is configured to:

generate a regression analysis equation using the obtained electricity parameter values of the representative test cases; and generate electricity parameter values of the remaining test cases using the generated regression analysis equation.

15. The system of claim 11, wherein the processor is configured to:

determine electric parameter values in the operation state table, matched with the collected electric parameter values;

compare operation states in the operation state table, mapped to the determined electric parameter values;

detect most matched operation states of the individual loads based on the comparison results; and estimate the detected most matched operation states as estimated operation states of the individual loads in the target electric power consumer.

* * * * *